United States Patent
Huang

(10) Patent No.: US 6,664,649 B2
(45) Date of Patent: Dec. 16, 2003

(54) LEAD-ON-CHIP TYPE OF SEMICONDUCTOR PACKAGE WITH EMBEDDED HEAT SINK

(75) Inventor: Chien-Ping Huang, Hsin-chu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/796,164

(22) Filed: Feb. 28, 2001

(65) Prior Publication Data

US 2002/0117764 A1 Aug. 29, 2002

(51) Int. Cl.⁷ .............................................. H01L 23/28
(52) U.S. Cl. ........................ 257/796; 257/675; 257/706; 257/717
(58) Field of Search ................................. 257/666, 675, 257/678, 684, 687, 690, 696, 701, 762, 706, 707, 709, 712, 720, 735, 778, 787, 792, 796, 686, 692, 788, 668, 753, 782, 783, 784, 717; 438/118, 106, 122–128; 361/707

(56) References Cited

U.S. PATENT DOCUMENTS

| | | | |
|---|---|---|---|
| 4,862,245 A | | 8/1989 | Pashby et al. ................. 357/70 |
| 4,916,519 A | | 4/1990 | Ward ............................ 357/70 |
| 4,965,654 A | | 10/1990 | Karner et al. ................. 357/70 |
| 5,293,301 A | * | 3/1994 | Tanaka et al. ............... 361/707 |
| 5,705,851 A | * | 1/1998 | Mostafazadeh et al. ..... 257/675 |
| 5,773,313 A | * | 6/1998 | Sato et al. ................... 438/123 |
| 5,776,799 A | * | 7/1998 | Song et al. .................. 438/118 |
| 5,874,783 A | * | 2/1999 | Yamada ....................... 257/778 |
| 5,986,209 A | * | 11/1999 | Tandy ........................ 257/686 |
| 6,110,761 A | * | 8/2000 | Ahmad ........................ 438/118 |
| 6,190,945 B1 | * | 2/2001 | Akram ........................ 438/122 |
| 6,436,550 B2 | * | 8/2002 | Sakata et al. ............... 428/553 |

* cited by examiner

Primary Examiner—Tom Thomas
Assistant Examiner—Douglas W. Owens
(74) Attorney, Agent, or Firm—Peter F. Corless; Steven M. Jensen; Edwards & Angell, LLP

(57) ABSTRACT

A lead-on-chip type of semiconductor package with an embedded heat sink is constructed on a leadframe including an outer-lead portion, an inner-lead portion, and a downset bond-finger portion. A semiconductor chip is arranged on a back side of the inner-lead portion, with its active surface being attached to the downset bond-finger portion. Then, a plurality of bonding wires are bonded between I/O pads of the chip and the downset bond-finger portion. Further, a heat sink is adhered to a front side of the inner-lead portion by an electrically-insulative and thermally-conductive adhesive material. Finally, an encapsulation body is formed to encapsulate the chip, the inner-lead portion of the leadframe, the bonding wires, and the heat sink. Owing to the embedded heat sink configuration, it allows the packaged chip to have good heat-dissipation efficiency during operation and also allows the overall package body to be made very compact in size.

11 Claims, 3 Drawing Sheets

LEAD-ON-CHIP TYPE OF SEMICONDUCTOR PACKAGE WITH EMBEDDED HEAT SINK

BACKGROUND OF THE INVENTION

1. Field of the Invention

This invention relates to integrated circuit packaging technology, and more particularly, to a lead-on-chip (LOC) type of semiconductor package with embedded heat sink, which allows the dissipation of heat from the packaged chip and also allows the overall package size to be made small.

2. Description of Related Art

An LOC type of semiconductor package is constructed on a leadframe of the type having no die pad and which is characterized by that the packaged semiconductor chip is mounted on the back side of the leads of the leadframe. This lead-on-chip configuration allows the packaged semiconductor chip to be better electrically coupled to the leadframe and also allows the overall package size to be made very small. DRAM (Dynamic Random Access Memory) devices, for instance, are usually packaged in this LOC configuration.

With today's advanced technology, DRAM devices are being made more increased in speed and data storage capacity, from the earlier 1 MB to the present 256 MB (megabyte). This, increased performance, however, would undesirably cause the DRAM chips to produce more heat during operation.

One solution to the heat-dissipation problem is to externally attach a thermally-conductive means to the semiconductor package to help the dissipation of heat from the packaged chip. One drawback to this solution, however, is that it would significantly increase the overall package size and manufacture cost.

Related patents, include, for example, the U.S. Pat. No. 4,862,245 entitled "PACKAGE SEMICONDUCTOR CHIP"; the U.S. Pat. No. 4,916,519 entitled "SEMICONDUCTOR PACKAGE"; and the U.S. Pat. No. 4,965,654 entitled "SEMICONDUCTOR PACKAGE WITH GROUND PLANE"; to name just a few.

SUMMARY OF THE INVENTION

It is therefore an objective of this invention to provide a new LOC package with embedded heat sink to help the dissipation of heat from the packaged chip.

It is another objective of this invention to provide a new LOC package with embedded heat sink, which allows the overall package size to be made very small.

In accordance with the foregoing and other objectives, the invention proposes a new LOC package with embedded heat sink.

Broadly recited, the LOC package of the invention comprises: (a) a leadframe including an outer-lead portion, an inner-lead portion, and a downset bond-finger portion; the inner-lead portion having a front side and a back side; (b) a semiconductor chip having an active surface and an inactive surface and being formed with a plurality of centrally-located I/O pads on the active surface thereof; the semiconductor chip being arranged on the back side of the inner-lead portion of the leadframe with the active surface thereof being insulatively attached to the downset bond-finger portion of the leadframe; (c) a plurality of bonding wires which are bonded between the respective I/O pads of the semiconductor chip and the downset bond-finger portion of the leadframe; (d) a heat sink attached to the front side of the inner-lead portion of the leadframe by means of an electrically-insulative and thermally-conductive adhesive material; and (e) an encapsulation body which encapsulates the semiconductor chip, the inner-lead portion of the leadframe, the bonding wires, and the heat sink, while exposing the outer-lead portion of the leadframe to outside.

Owing to the embedded heat sink configuration, it allows the packaged semiconductor chip to have good heat-dissipation efficiency during operation and also allows the overall package body to be made very compact in size.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The LOC package according to the invention is disclosed in full details by way of several preferred embodiments in the following with reference to FIG. 1, FIG. 2, FIG. 3, FIG. 4 and FIG. 5, respectively.

Figure 1:
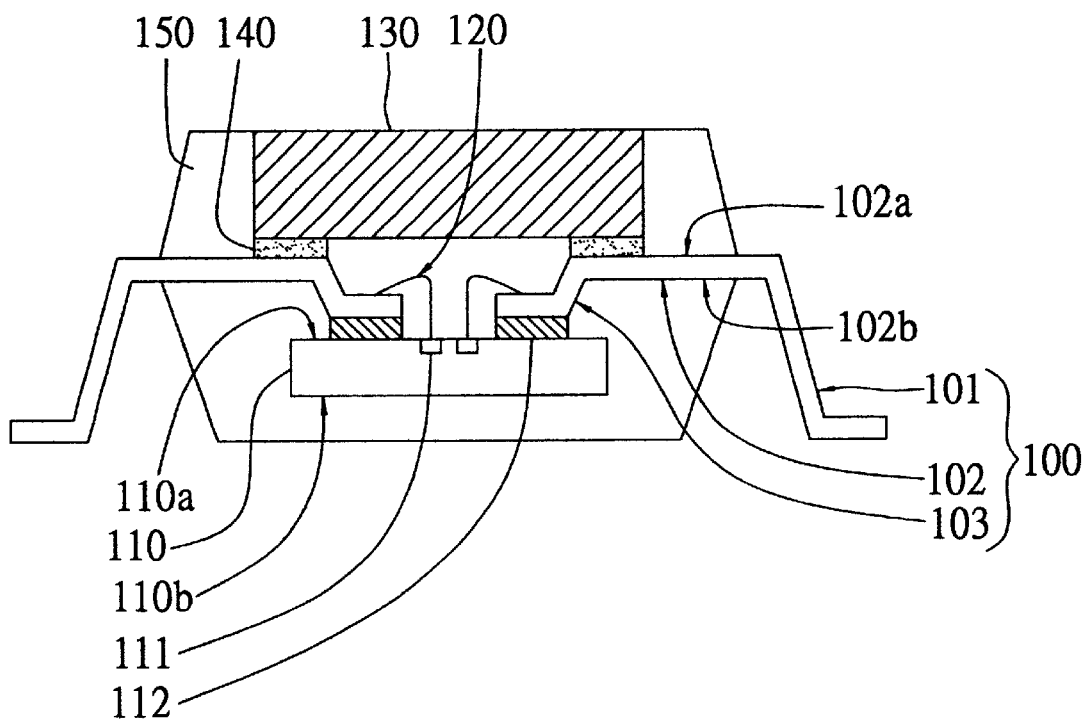
FIG. 1 is a schematic sectional diagram showing a first preferred embodiment of the LOC package according to the invention.

First Preferred Embodiment (FIG. 1)

FIG. 1 is a schematic sectional diagram showing the first preferred embodiment of the LOC package with embedded heat sink according to the invention.

As shown, this LOC package constructed on a leadframe 100 including an outer-lead portion 101, an inner-lead portion 102, and a downset bond-finger portion 103. The inner-lead portion 102 has a front side 102a and a back side 102b. Further, the downset bond-finger portion 103 is arranged at a downset position with respect to the inner-lead portion 102.

The leadframe 100 is used for mounting a semiconductor chip 110 having an active surface 110a and an inactive surface 110b and formed with a plurality of centrally-located I/O pads 111 on the active surface 110a. During assembly, the semiconductor chip 110 is arranged on the back side 102b of the inner-lead portion 102 of the leadframe 100, with the active surface 110a thereof being adhered to the downset bond-finger portion 103 by means of electrically-insulative adhesive means, such as polyimide tapes 112.

As the semiconductor chip 110 is mounted in position, a wire-bonding process is performed to bond a plurality of bonding wires 120, such as gold wires, between the downset bond-finger portion 103 of the leadframe 100 and the respective I/O pads 111 of the semiconductor chip 110 for the purpose of electrically coupling the semiconductor chip 110 to the leadframe 100.

Next, a heat sink 130 is mounted on the front side 102a of inner-lead portion 102 of the leadframe 100 and adhered to the same by means of an electrically-insulative and thermally-conductive adhesive material 140. The heat sink 130 is made of a highly thermally-conductive material, such as copper (Cu) or aluminum (Al). In this embodiment, the electrically-insulative and thermally-conductive adhesive material 140 is only pasted on the front side 101a of the inner-lead portion 102 of the leadframe 100.

Finally, an encapsulation body 150 is formed to encapsulate the semiconductor chip 110, the inner-lead portion 102 of the leadframe 100, all the bonding wires 120, and the heat sink 130, while exposing the outer-lead portion 101 of the leadframe 100 and one surface of the heat sink 130 to the outside. This completes the construction of the LOC package.

With this LOC package, the heat produced by the semiconductor chip 110 during operation can be dissipated via the heat sink 130 to the outside atmosphere. Since the heat sink 130 is embedded together with the semiconductor chip 110 in the encapsulation body 150, rather than being externally attached, it allows the overall package size to be very small.

Figure 2:
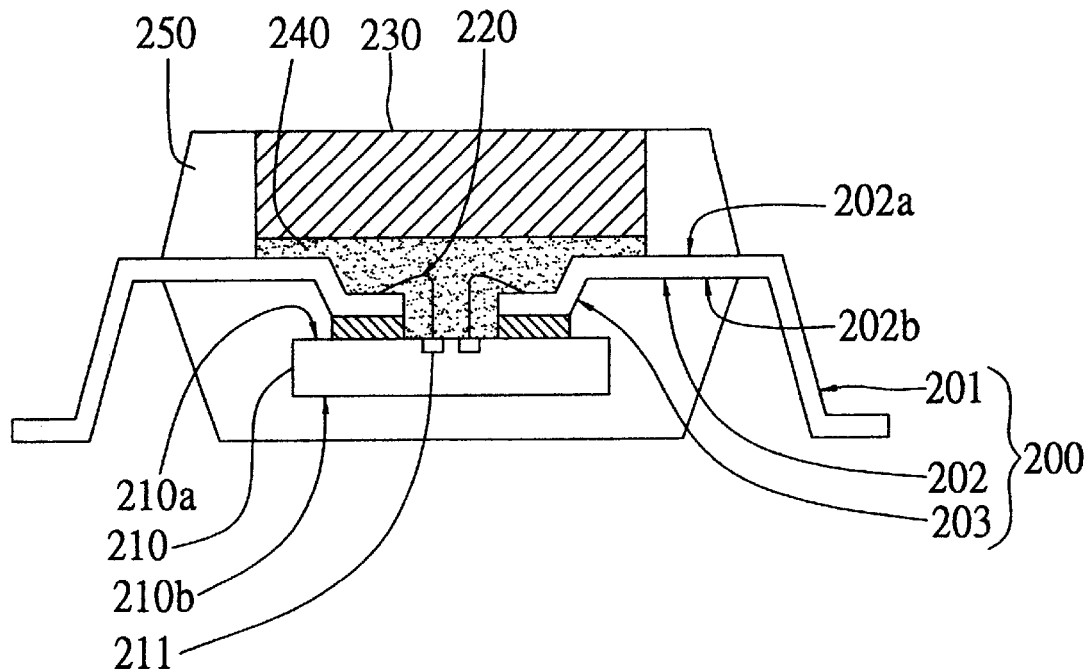
FIG. 2 is a schematic sectional diagram showing a second preferred embodiment of the LOC package according to the invention.

Second Preferred Embodiment (FIG. 2)

FIG. 2 is a schematic sectional diagram showing the second preferred embodiment of the LOC package with embedded heat sink according to the invention.

As shown, the LOC package of this embodiment includes: (a) a leadframe 200 having an outer-lead portion 201, an inner-lead portion 202, and a downset bond-finger portion 203; (b) a semiconductor chip 210 having an active surface 210a and an inactive surface 210b and formed with a plurality of centrally-located I/O pads 211 on the active surface 210a; (c) a plurality of bonding wires 220 which are bonded between the downset bond-finger portion 203 of the leadframe 200 and the I/O pads 211 of the semiconductor chip 210, (d) a heat sink 230 mounted on the inner-lead portion 202 of the leadframe 200 by means of an electrically-insulative and thermally-conductive adhesive material 240; and (e) an encapsulation body 250 for encapsulating the semiconductor chip 210, the inner-lead portion 202 of the leadframe 200, all the bonding wires 220, and the heat sink 230, while exposing the outer-lead portion 201 of the leadframe 200 and one surface of the embedded heat sink 230 to the outside.

The second preferred embodiment of FIG. 2 is largely structured and assembled in the same manner as the previous one shown in FIG. 1, except that here the electrically-insulative and thermally-conductive adhesive material 240 is filled in the entire space between the semiconductor chip 210 and the heat sink 230 to thereby form a direct heat path from the active surface 210a of the semiconductor chip 210 to the heat sink 230. This arrangement allows the overall heat-dissipation efficiency to be better than the previous embodiment.

Figure 3:
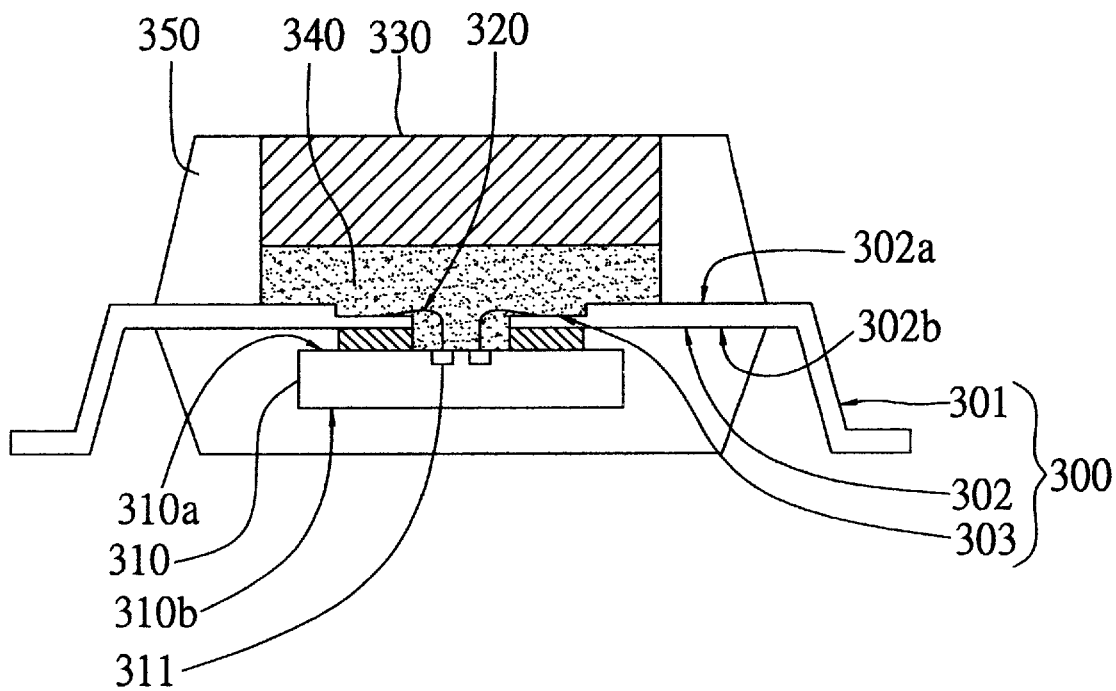
FIG. 3 is a schematic sectional diagram showing a third preferred embodiment of the LOC package according to the invention.

Third Preferred Embodiment (FIG. 3)

FIG. 3 is a schematic sectional diagram showing the third preferred embodiment of the LOC package according to the invention.

As shown, the LOC package of this embodiment includes: (a) a leadframe 300 having an outer-lead portion 301, an inner-lead portion 302, and a downset bond-finger portion 303; (b) a semiconductor chip 310 having an active surface 310a and an inactive surface 310b and formed with a plurality of centrally-located I/O pads 311 on the active surface 310a; (c) a plurality of bonding wires 320 which are bonded between the downset bond-finger portion 303 of the leadframe 300 and the I/O pads 311 of the semiconductor chip 310; (d) a heat sink 330 mounted on the inner-lead portion 302 of the leadframe 300 by means of an electrically-insulative and thermally-conductive adhesive material 340; and (e) an encapsulation body 350 for encapsulating the semiconductor chip 310, the inner-lead portion 302 of the leadframe 300, all the bonding wires 320, and the heat sink 330, while exposing the outer-lead portion 301 of the leadframe 300 and one surface of the embedded heat sink 330 to the outside.

The third preferred embodiment of FIG. 3 is largely structured and assembled in the same manner as the previous one shown in FIG. 2, except that here the downset bond-finger portion 303 of the leadframe 300 is formed by stamping or half-etching the terminal end of the inner-lead portion 302 of the leadframe 300 into a shouldered shape (rather than by bending down the terminal end). This shouldered downset bond-finger portion 303 can also serve as a bonding point for the bonding wires 320.

Figure 4:
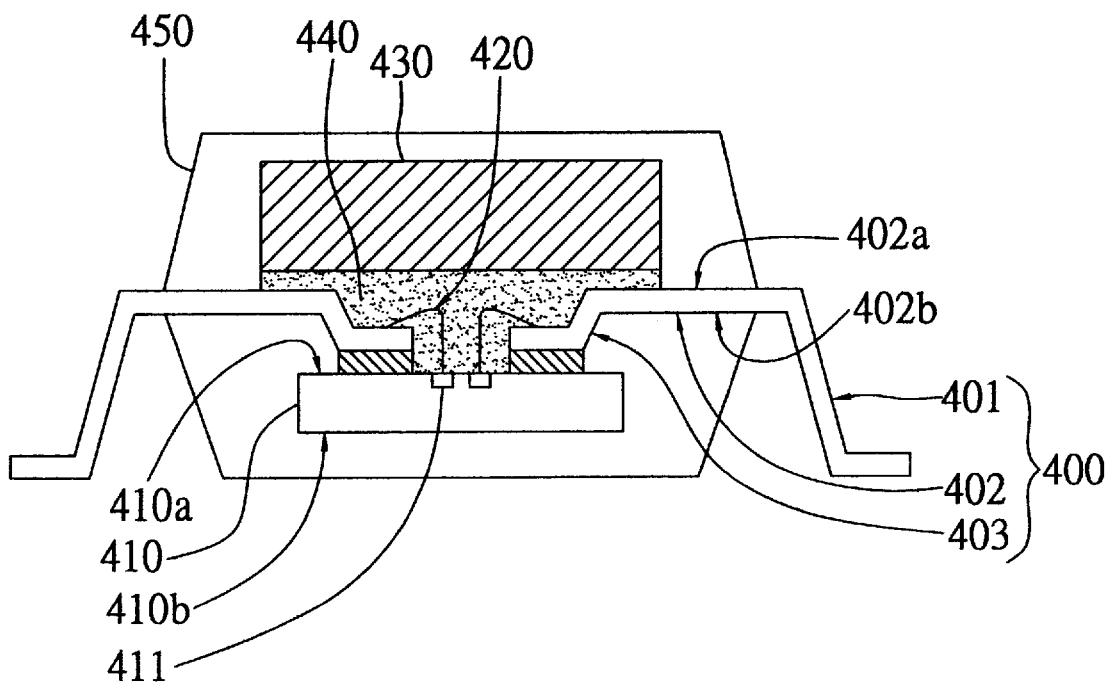
FIG. 4 is a schematic sectional diagram showing a fourth preferred embodiment of the LOC package according to the invention.

Fourth Preferred Embodiment (FIG. 4)

FIG. 4 is a schematic sectional diagram showing the fourth preferred embodiment of the LOC package according to the invention.

As shown, the LOC package of this embodiment includes: (a) a leadframe 400 having an outer-lead portion 401, an inner-lead portion 402, and a downset bond-finger portion 403; (b) a semiconductor chip 410 having an active surface 410a and an inactive surface 410b and formed with a plurality of centrally-located I/O pads 411 on the active surface 410a; (c) a plurality of bonding wires 420 which are bonded between the downset bond-finger portion 403 of the leadframe 400 and the I/O pads 411 of the semiconductor chip 410; (d) a heat sink 430 mounted on the inner-lead portion 402 of the leadframe 400 by means of an electrically-insulative and thermally-conductive adhesive material 440; and (e) an encapsulation body 450 for encapsulating the semiconductor chip 410, the inner-lead portion 402 of the leadframe 400; all the bonding wires 420, and the heat sink 430, while exposing the outer-lead portion 401 of the leadframe 400 to the outside.

The fourth preferred embodiment of FIG. 4 is largely structured and assembled in the same manner as the one shown in FIG. 2, except that here the heat sink 430 is entirely embedded in the encapsulation body 450 without being exposed to the outside. This allows the heat produced by the semiconductor chip 410 to be dissipated successively through the electrically-insulative and thermally-conductive adhesive material 440, the heat sink 430, and the encapsulation body 450 to the outside atmosphere.

Figure 5:
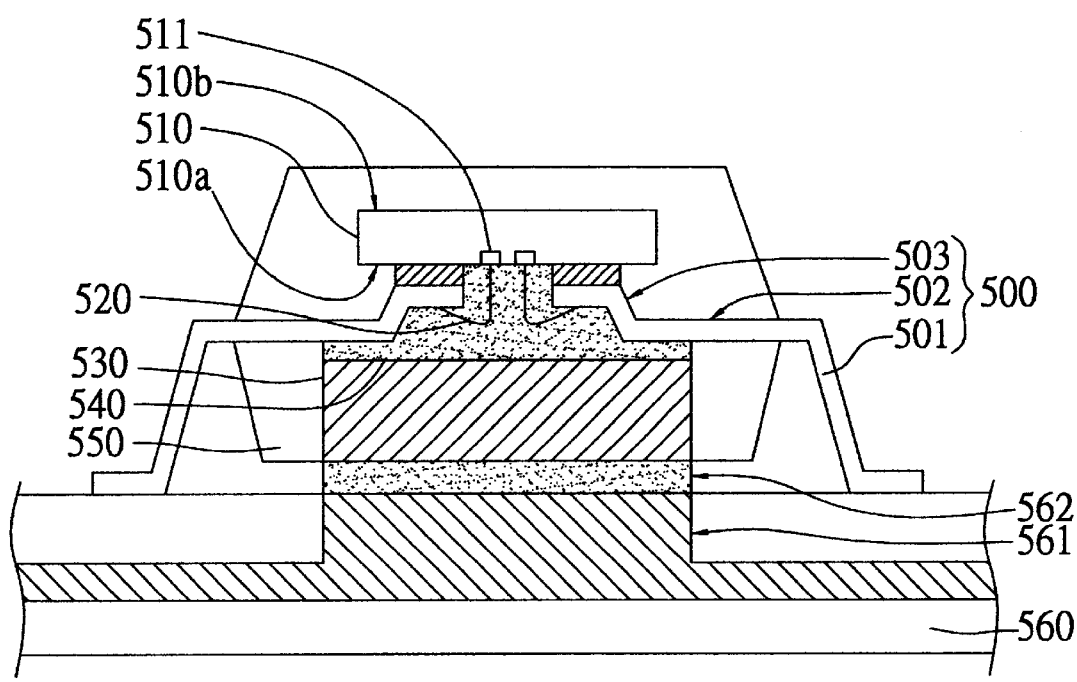
FIG. 5 is a schematic sectional diagram showing a fifth preferred embodiment of the LOC package according to the invention.

Fifth Preferred Embodiment (FIG. 5)

FIG. 5 is a schematic sectional diagram showing the fifth preferred embodiment of the LOC package according to the invention.

As shown, the LOC package of this embodiment includes: (a) a leadframe 500 having an outer-lead portion 501, an inner-lead portion 502, and a downset bond-finger portion 503; (b) a semiconductor chip 510 having an active surface 510a and an inactive surface 510b and formed with a plurality of centrally located I/O pads 511 on the active surface 510a; (c) a plurality of bonding wires 520 which are bonded between the downset bond-finger portion 503 of the leadframe 500 and the I/O pads 511 of the semiconductor chip 510; (d) a heat sink 530 mounted on the inner-lead portion 502 of the leadframe 500 by means of an electrically-insulative and thermally-conductive adhesive material 540; and (e) an encapsulation body 550 for encapsulating the semiconductor chip 510, the inner-lead portion 502 of the leadframe 500, all the bonding wires 520, and the heat sink 530, while exposing the outer-lead portion 501 of the leadframe 500 and one surface of the embedded heat sink 530 to the outside.

The fifth preferred embodiment of FIG. 5 is largely structured and assembled in the same manner as the one shown in FIG. 2, except that here the outer-lead portion 501 of the leadframe 500 is bent upside-down to make an inverted LOC package configuration. When the finished LOC package is mounted on a printed circuit board (PCB) 560 having a ground plane 561, it allows the exposed surface of the heat sink 530 to be thermally coupled to the ground plane 561 of the PCB 560 by means of solder 562. This allows the heat produced by the packaged semiconductor chip 510 to be dissipated from the active surface 510a thereof to the embedded heat sink 530, and then from the embedded heat sink 530 to the externally coupled ground plane 561 of the PCB 560, thereby further increasing the heat-dissipation efficiency.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, which comprises:
   (a) a leadframe including an outer-lead portion, an inner-lead portion, and a downset bond-finger portion, the inner-lead portion having a front side and a back side;
   (b) a semiconductor chip having an active surface and an inactive surface and being formed with a plurality of centrally-located I/O pads on the active surface thereof, the semiconductor chip being arranged on the back side of the inner-lead portion of the leadframe with the active surface thereof being insulatively attached to the downset bond-finger portion of the leadframe;
   (c) a plurality of bonding wires which are bonded between the respective I/O pads of the semiconductor chip and the downset bond-finger portion of the leadframe;
   (d) a heat sink attached to the front side of the inner-lead portion of the leadframe by means of an electrically-insulative and thermally-conductive adhesive material, such that a space is formed between the heat sink and the semiconductor chip for receiving the bonding wires, and the space is filled with the electrically-insulative and thermally-conductive adhesive material that encapsulates the bonding wires received in the space and the I/O pads of the semiconductor chip, so as to allow the electrically-insulative and thermally-conductive adhesive material to be directly in contact with both the semiconductor chip and the heat sink that are attached to opposite sides of the leadframe; and
   (e) an encapsulation body which encapsulates the semiconductor chip, the inner-lead portion of the leadframe, the bonding wires, and the heat sink, while exposing the outer-lead portion of the leadframe to outside.

2. The semiconductor package of claim 1, wherein the downset bond-finger portion of the leadframe is formed by bending the terminal of the inner-lead portion of the leadframe to a downset position.

3. The semiconductor package of claim 1, wherein the downset bond-finger portion of the leadframe is formed by half-etching the terminal of the inner-lead portion of the leadframe into a shouldered shape.

4. The semiconductor package of claim 1, wherein the downset bond-finger portion of the leadframe is formed by stamping the terminal of the inner-lead portion of the leadframe into a shouldered shape.

5. The semiconductor package of claim 1, wherein the semiconductor chip is insulatively attached to the downset bond-finger portion of the leadframe by means of polyimide tapes.

6. The semiconductor package of claim 1, wherein the electrically-insulative and thermally-conductive adhesive material is applied only to the front side of the inner-lead portion of the leadframe.

7. The semiconductor package of claim 1, wherein the heat sink is entirely embedded in the encapsulation body and unexposed to the outside of the encapsulation body.

8. The semiconductor package of claim 1, wherein the heat sink has one surface exposed to the outside of the encapsulation body.

9. The semiconductor package of claim 8, wherein the outer-lead portion of the leadframe is bent upside-down to make an inverted lead-on-chip package configuration to allow the exposed surface of the heat sink to be thermally coupled to an external ground plane in a printed circuit board.

10. The semiconductor package of claim 1, wherein the heat sink is made of copper.

11. The semiconductor package of claim 1, wherein the heat sink is made of aluminum.

* * * * *